United States Patent
Patel et al.

(10) Patent No.: US 7,518,392 B2
(45) Date of Patent: Apr. 14, 2009

(54) SYSTEMS AND METHODS FOR CONTINUITY TESTING USING A FUNCTIONAL PATTERN

(75) Inventors: Gunvant T. Patel, Garland, TX (US); Trevor J. Tarsi, Dallas, TX (US); Yun-Fu Wang, Taipai (TW); Anthony J. Lendino, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 11/461,942

(22) Filed: Aug. 2, 2006

(65) Prior Publication Data
US 2008/0030217 A1    Feb. 7, 2008

(51) Int. Cl.
*G01R 31/26* (2006.01)
(52) U.S. Cl. .................................... 324/765
(58) Field of Classification Search .............. None
See application file for complete search history.

(56) References Cited
U.S. PATENT DOCUMENTS

| | | | | |
|---|---|---|---|---|
| 4,837,502 A | * | 6/1989 | Ugenti | 324/523 |
| 5,164,663 A | * | 11/1992 | Alcorn | 324/73.1 |
| 6,750,663 B2 | * | 6/2004 | Patel | 324/73.1 |
| 6,919,727 B2 | * | 7/2005 | Patel et al. | 324/535 |
| 6,941,232 B2 | * | 9/2005 | Burke et al. | 702/57 |

* cited by examiner

Primary Examiner—Jermele M Hollington
(74) Attorney, Agent, or Firm—Yingsheng Tung; Wade J. Brady, III; Frederick J. Telecky, Jr.

(57) ABSTRACT

Various systems and methods for device configuration are disclosed herein. For example, some embodiments of the present invention provide high speed pin continuity and pin-to-pin short tester circuits. Such circuits include a threshold driver, a test driver, and a comparator. An input of the threshold driver is electrically coupled to a voltage threshold, and an output of the threshold driver is electrically coupled to a test pin node via a current limiting resistor. An input of the test driver is electrically coupled to a drive data input, and an output of the test driver is electrically coupled to the test pin node. One input of the comparator is electrically coupled to the test pin node, and the other input of the comparator is electrically coupled to a threshold comparator input.

16 Claims, 6 Drawing Sheets

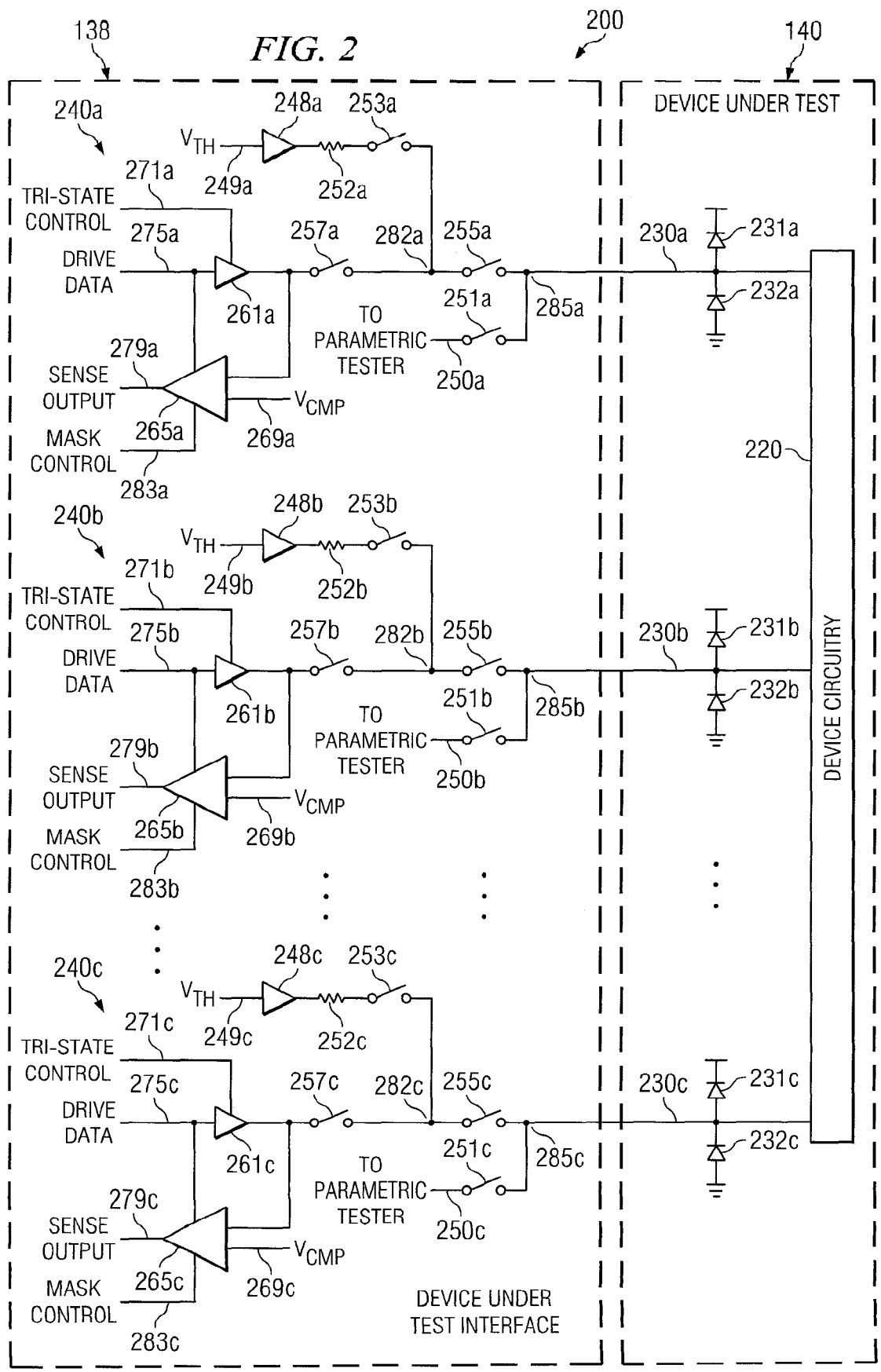

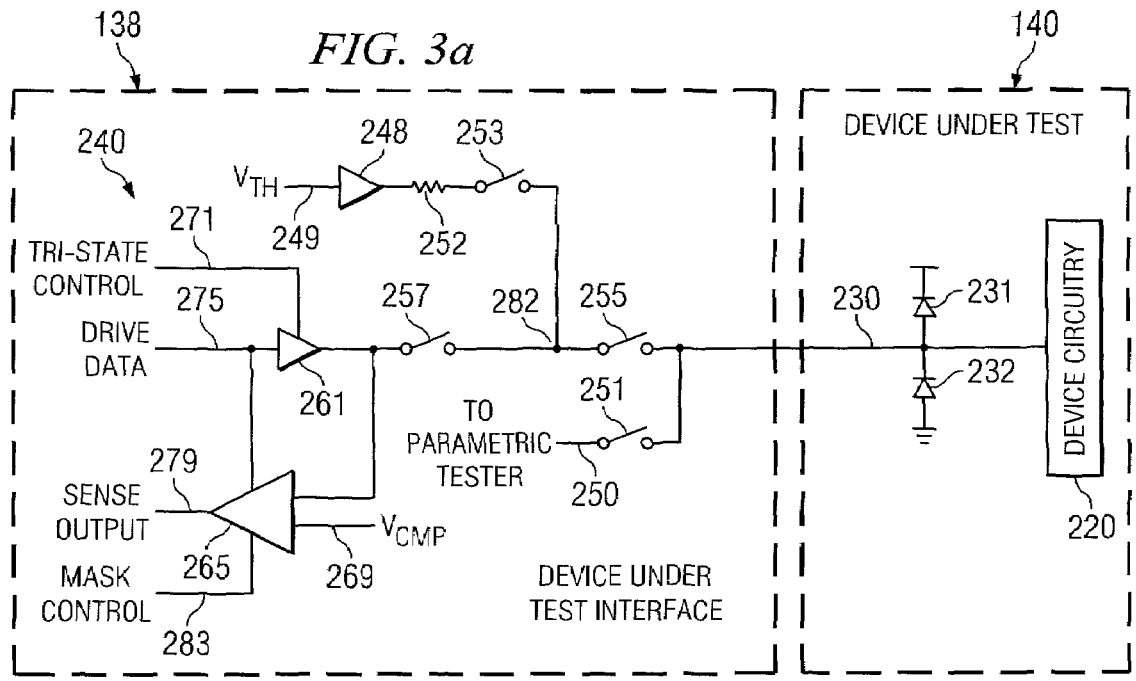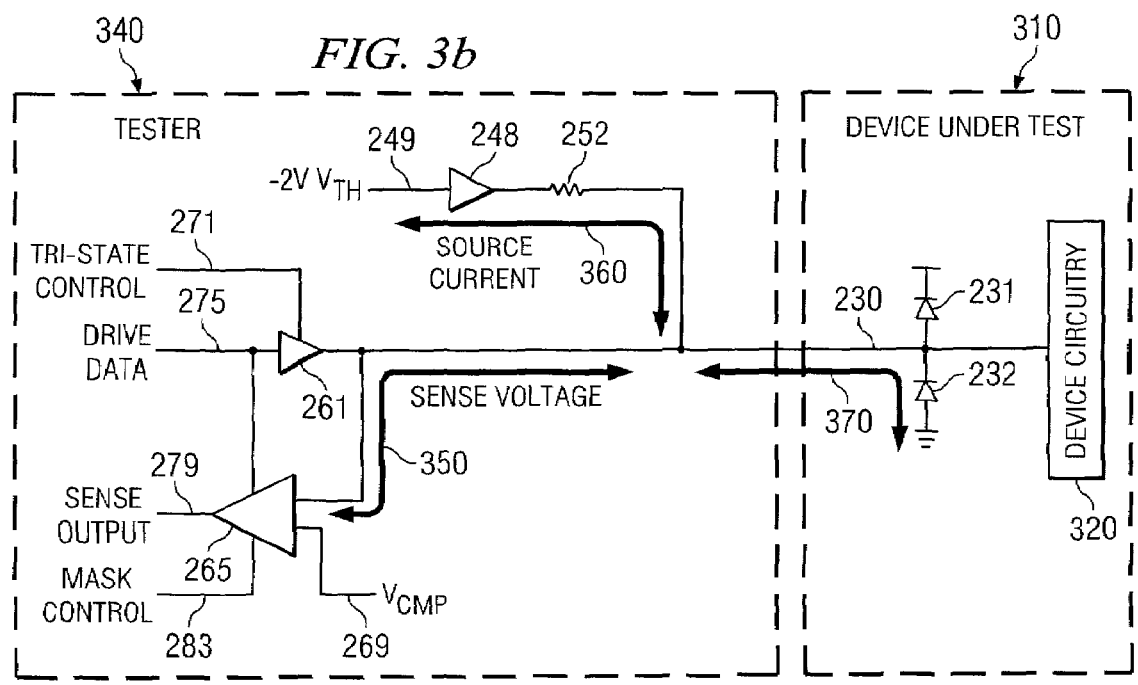

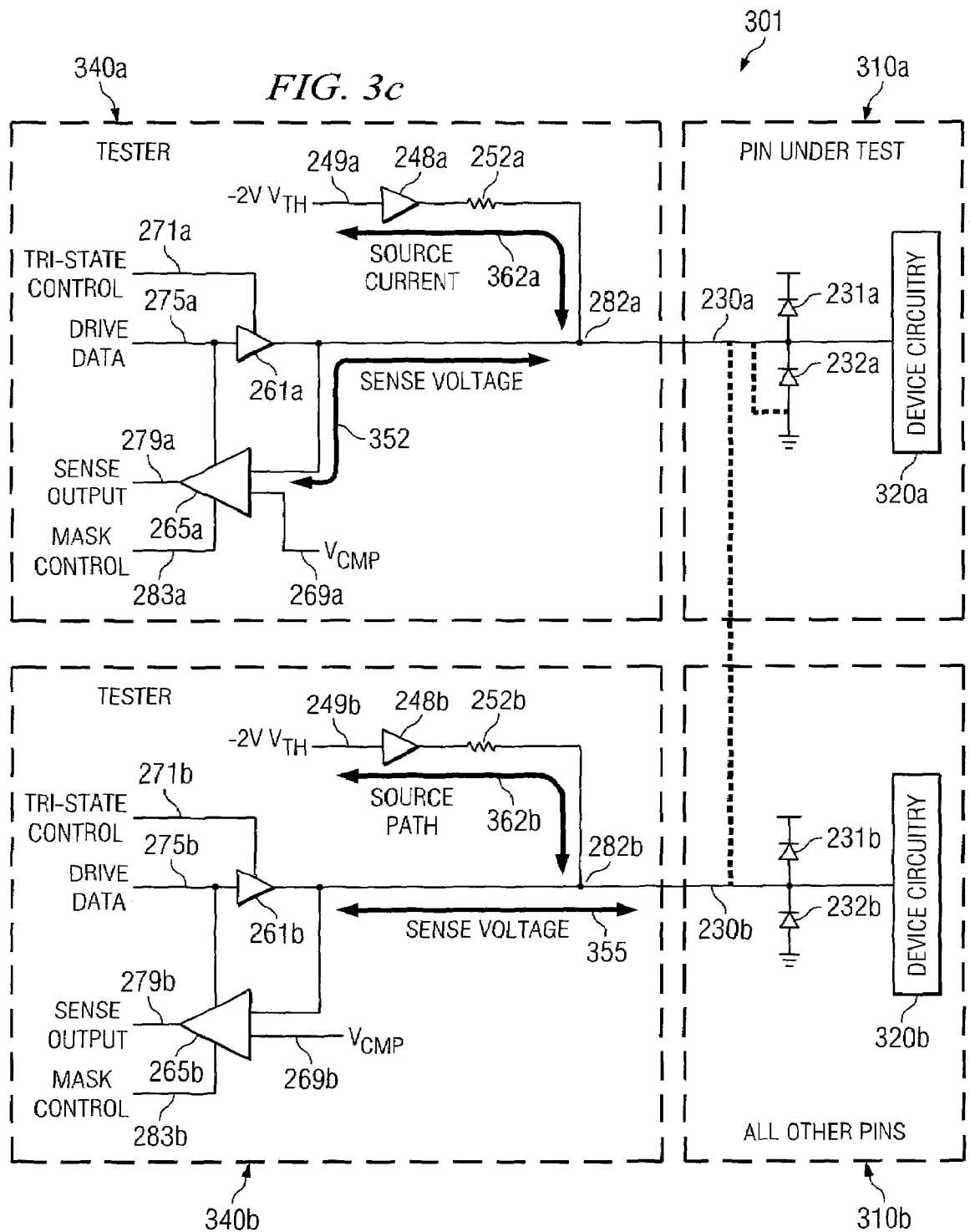

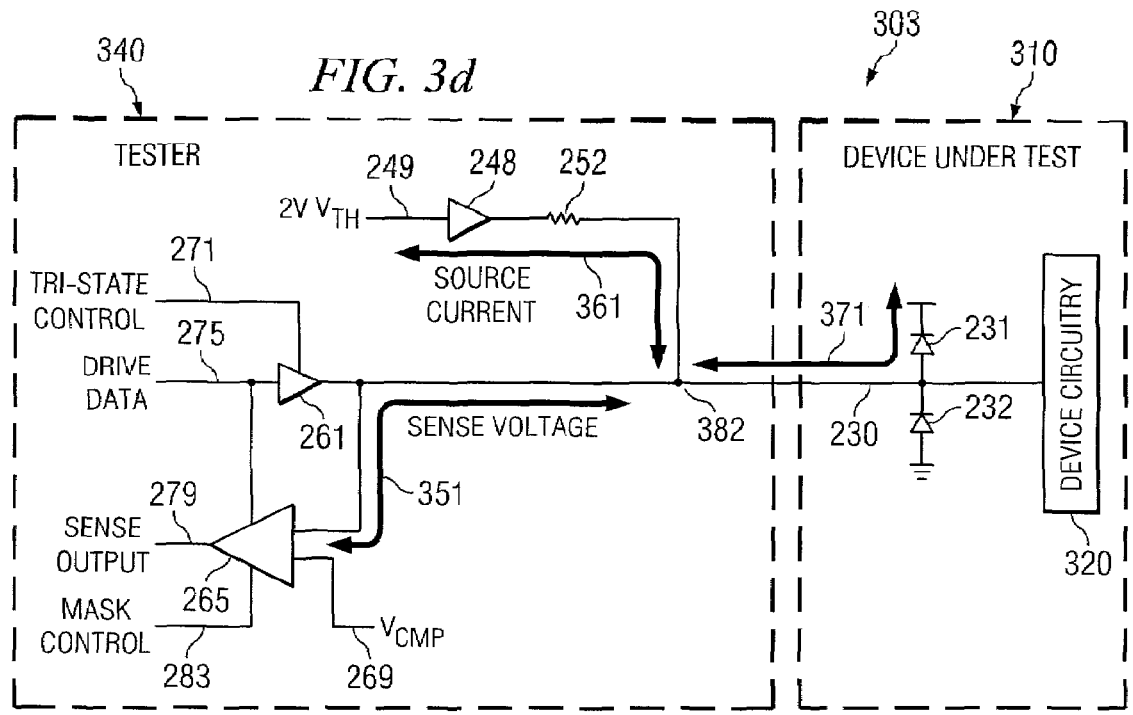
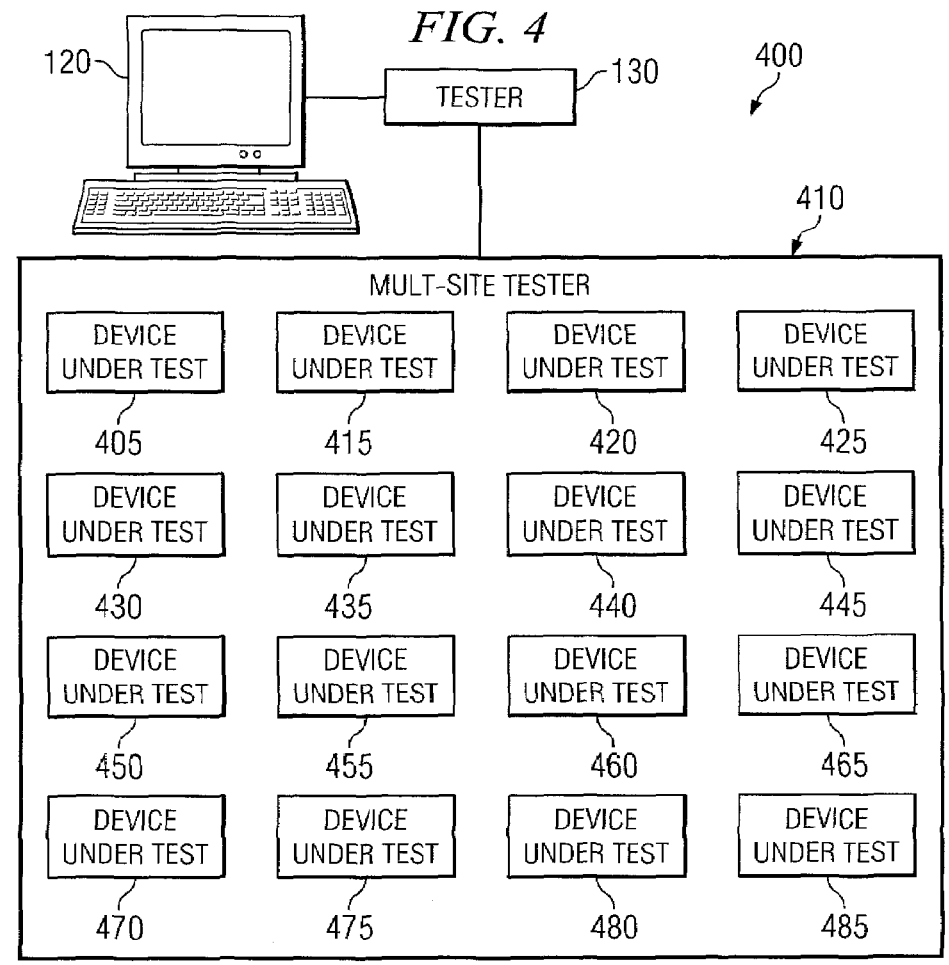

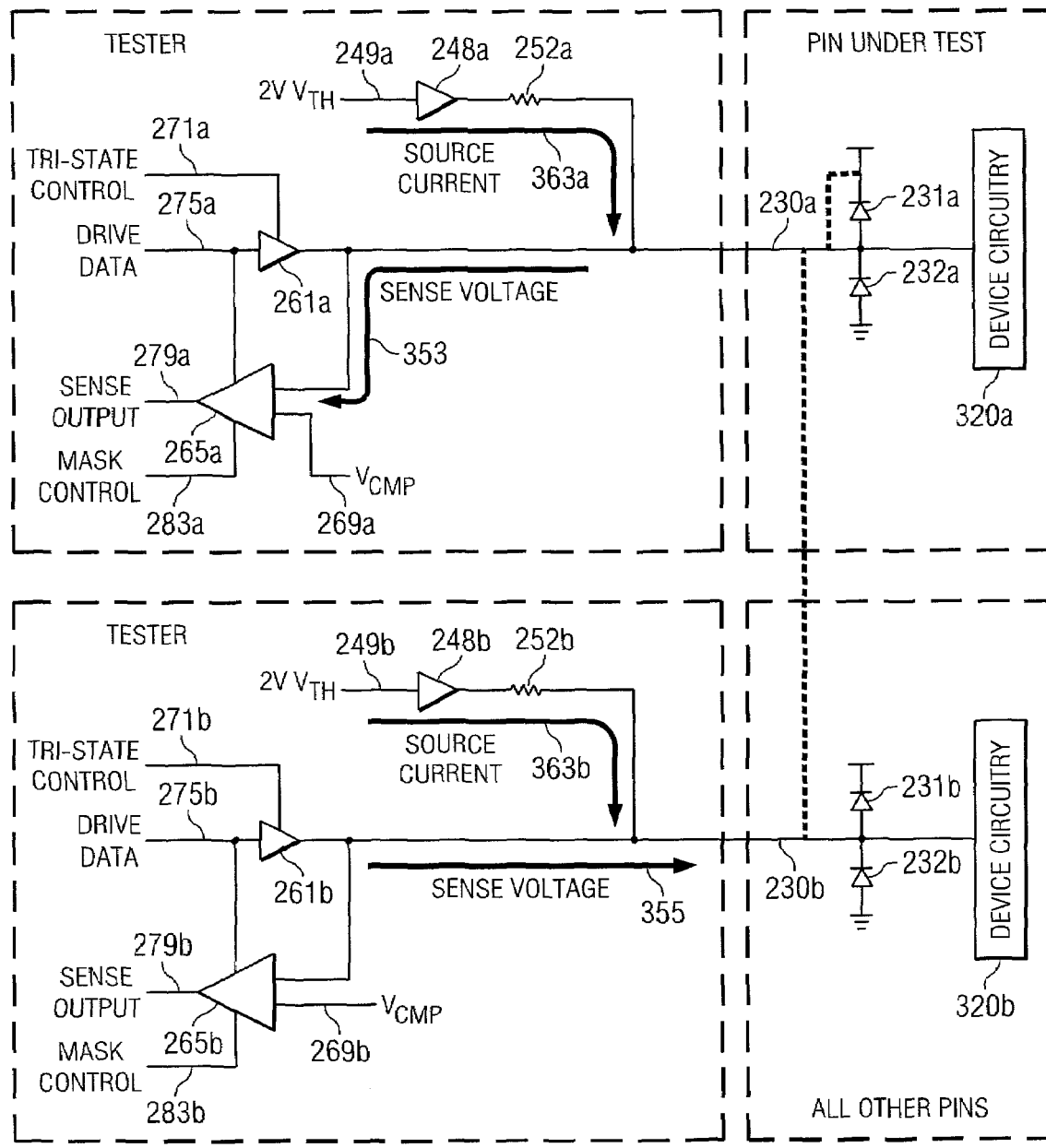

SYSTEMS AND METHODS FOR CONTINUITY TESTING USING A FUNCTIONAL PATTERN

BACKGROUND OF THE INVENTION

The present invention is related to systems and methods for testing semiconductor devices, and in particular to systems and methods for testing semiconductor devices using a functional pattern.

It is common for semiconductor devices to be inoperable at the end of the manufacturing process due to one or more manufacturing errors. For this reason, various tests are performed on semiconductor devices at the end of the manufacturing process and/or at interim points in the manufacturing process. For example, one existing method provides for testing each pin for continuity by serially testing one pin at a time using a parametric tester. Subsequently, each pin is serially tested for shorts to one or more of the other pins of the semiconductor device using the same parametric tester. Such an approach is effective for determining proper device connectivity, however, the approach is time consuming. Such time consumption in the testing phase of the semiconductor manufacturing process is costly.

Thus, for at least the aforementioned reasons, there exists a need in the art for advanced systems and methods for performing semiconductor device tests.

BRIEF SUMMARY OF THE INVENTION

The present invention is related to systems and methods for testing semiconductor devices, and in particular to systems and methods for testing semiconductor devices using a functional pattern.

Some embodiments of the present invention provide methods for testing a device under test. Such methods include providing a tester that includes a threshold driver, a test driver, and a comparator. An input of the threshold driver is electrically coupled to a voltage threshold, and an output of the threshold driver is electrically coupled to a test pin node. An input of the test driver is electrically coupled to a drive data input, and an output of the test driver is electrically coupled to a first measurement switch. One input of the comparator is electrically coupled to a second measurement switch, and the other input of the comparator is electrically coupled to a threshold comparator input. The methods further include closing the first measurement switch and the second measurement switch such that the output of the test driver and one input of the comparator are electrically coupled to the test pin node. In some cases of the aforementioned embodiments, both the first and second measurement switches are implemented using the same measurement switch. Thus, in such cases, closing the first and second measurement switches requires closing only a single measurement switch.

In some instances of the aforementioned embodiments, the test pin node is electrically coupled to a pin of a device under test. In such instances, the methods may further include applying a first voltage to the threshold voltage input, and a second voltage to the threshold comparator input. In some cases where the second voltage is greater than the first voltage, the methods may include sensing an output of the comparator. In such cases where it is detected that a voltage at the test pin node is less than the second voltage, the device under test is failed for lack of continuity. As one particular example, the device under test may include a ground diode electrically coupling the pin of the device under test to ground, a first voltage of approximately negative 2V, and a second voltage of approximately negative 1.1V. In such a case, where sensing the output of the comparator indicates a voltage at the test pin node that is less than the second voltage, the device under test is failed for lack of continuity between the pin of the device under test and ground via the ground diode.

In some cases of the aforementioned embodiments where the second voltage is greater than the first voltage, another pin associated with the device under test may be driven with a third voltage. In such a case, the output of the comparator may be sensed and it may be determined that a voltage at the test pin node is greater than the second voltage. In such a case, the device under test is failed for a short between the first pin and the second pin or between the first pin and ground. As one particular example, one pin of the device under test may be driven with a third voltage that is approximately positive 0.3V, the first voltage is approximately negative 2.0V, and the second voltage is approximately negative 0.3V. In such a case, the device under test is failed for a short between the two pins where the output of the comparator indicates that the voltage at the test pin node greater than the second voltage is detected.

In other cases of the aforementioned instances where the second voltage is less than the first voltage, the methods may further include sensing the output of the comparator and determining that the device fails for lack of continuity where the output of the comparator indicates that the voltage at the test pin node is greater than the second voltage. As one particular example, the device under test includes a VCC diode electrically coupling the pin of the device under test to VCC, the first voltage is approximately positive 2V, and the second voltage is approximately positive 1.1V, the method further includes sensing an output of the comparator where the voltage at the test pin node is greater than the second voltage. In such a case, the device under test is failed for lack of continuity between the pin of the device under test and VCC via the VCC diode.

In some cases of the aforementioned embodiments where the second voltage is less than the first voltage, another pin associated with the device under test may be driven with a third voltage. In such a case, the output of the comparator may be sensed and it may be determined that a voltage at the test pin node is less than the second voltage. In such a case, the device under test is failed for a short between the first pin and the second pin or VCC. As one particular example, one pin of the device under test is driven with a third voltage that is approximately negative 0.5V, the first voltage is approximately positive 2.0V, and the second voltage is approximately positive 0.3V. In such a case, the device under test is failed for a short between the two pins where the output of the comparator indicates that the voltage at the test pin node is less than the second voltage.

Other embodiments of the present invention provide high speed pin continuity and pin-to-pin short tester circuits. Such circuits include a threshold driver, a test driver, and a comparator. An input of the threshold driver is electrically coupled to a voltage threshold, and an output of the threshold driver is electrically coupled to a test pin node via a current limiting resistor. An input of the test driver is electrically coupled to a drive data input, and an output of the test driver is electrically coupled to the test pin node. One input of the comparator is electrically coupled to the test pin node, and the other input of the comparator is electrically coupled to a threshold comparator input. In some instances of the aforementioned embodiments, the current limiting is electrically coupled to the test pin node via a source switch. In one or more instances of the aforementioned embodiments, the pin of the comparator is electrically coupled to the test pin node via a measurement switch, and the output of the driver is also electrically coupled to the test pin node via the measurement switch. In some cases, the test pin node is electrically coupled to an I/O via an I/O switch. In one or more cases, the comparator includes a drive control that is electrically coupled to a mask control input that is operable to mask the output of the comparator. The output of the comparator indicates a pass/fail status of a device under test.

Yet other embodiments of the present invention provide methods for testing a device under test. The methods comprise providing a tester that includes a threshold driver, a test driver, and a comparator. An input of the threshold driver is electrically coupled to a threshold voltage input, and an output of the threshold driver is electrically coupled to a test pin node. An input of the test driver is electrically coupled to a drive data input, and an output of the test driver is electrically coupled to a measurement switch. One input of the comparator is electrically coupled to the measurement switch, another input of the comparator is electrically coupled to a threshold comparator input. The methods further include closing the measurement switch such that both the output of the test driver and one input of the comparator are electrically coupled to the test pin node. In addition, a first voltage is applied to the threshold voltage input, and a second voltage is applied to the threshold comparator input.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 2 depicts a tester in relation to a device under test and in accordance with one or more embodiments of the present invention;

FIGS. 3a-3e depict portions of the tester of FIG. 2 configured in particular forms to achieve continuity and pin-to-pin testing in accordance with some embodiments of the present invention; and FIG. 4 depicts a multi-site test station controlled by a tester in accordance with one or more embodiments of the present invention.

DETAILED DESCRIPTION OF THE INVENTION

Figure 1:
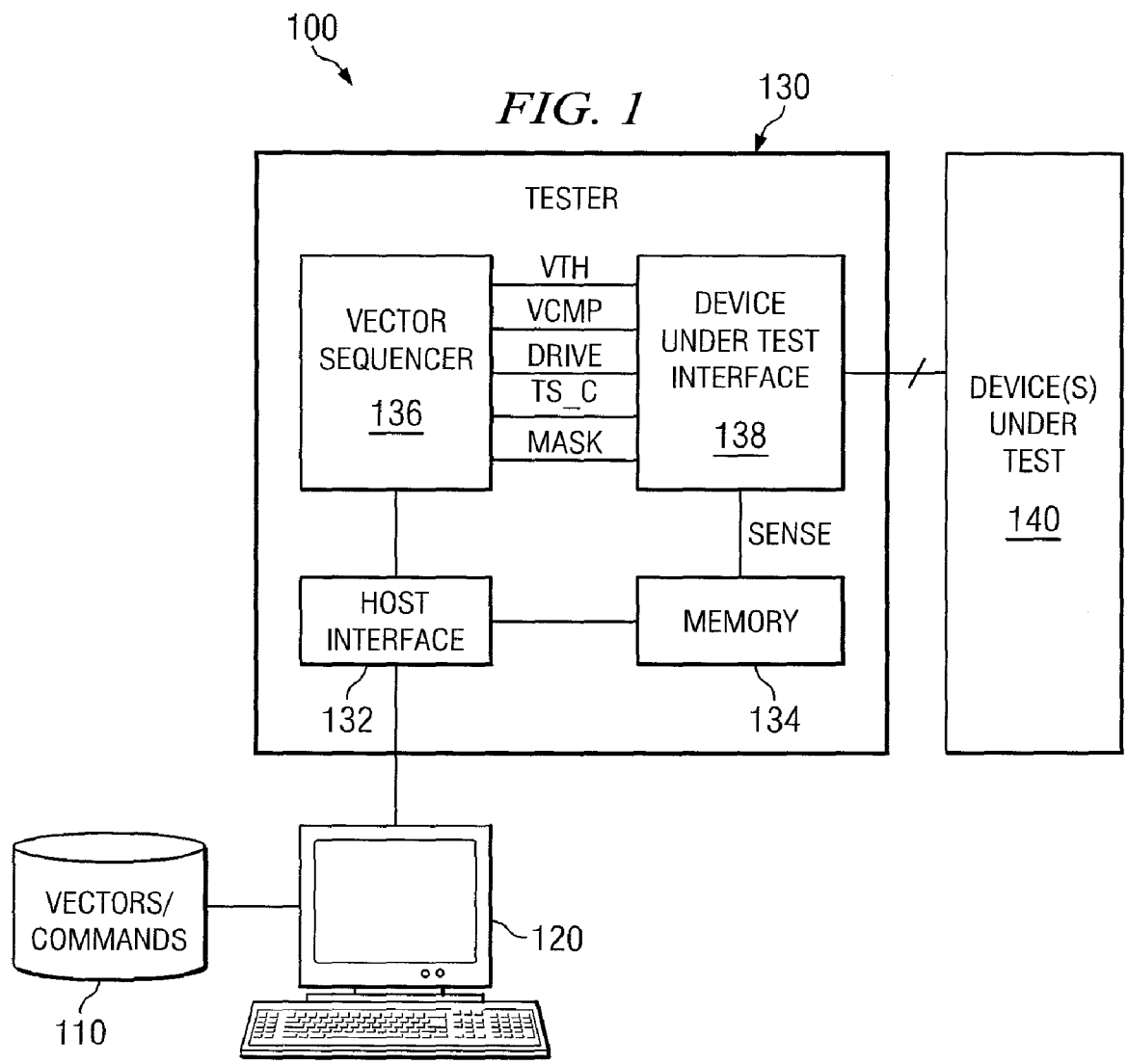
FIG. 1 shows a tester set-up that may be employed in relation to various embodiments of the present invention.

The present invention is related to systems and methods for testing semiconductor devices, and in particular to systems and methods for testing semiconductor devices using a functional pattern.

Turning to FIG. 1, a tester set-up 100 that may be employed in relation to various embodiments of the present invention is depicted. Tester set-up 100 includes a microprocessor based machine 120 that is associated with a computer readable medium 110, and a tester 130. Microprocessor based machine 120 may be any microprocessor based machine such as, for example, a personal computer that is communicably coupled to tester 130. Alternatively, microprocessor based machine may consist essentially of a processor that is incorporated directly into tester 130. Based on the disclosure provided herein, one of ordinary skill in the art will recognize a number of microprocessor based machines and/or processors that may be used in relation to one or more embodiments of the present invention. Computer readable medium 110 may be any medium that is accessible to a processor based machine. Thus, for example, computer readable medium 110 may be a hard disk drive, a server machine, an optical disk, a magnetic storage medium, a random access memory, an electrically erasable read only memory, any combination of the aforementioned, and/or the like. Based on the disclosure provided herein, one of ordinary skill in the art will recognize a myriad of computer readable media that may be employed in relation to embodiments of the present invention. Computer readable medium 110 includes a number of test vectors and commands that may be accessed from computer readable medium 110 by microprocessor based machine 120 and provided to tester 130 to perform continuity and/or pin-to-pin short tests in accordance with methodology described herein.

Tester 130 includes a host interface 132, a vector sequencer 136, and a device under test interface 138. Host interface 132 includes circuitry that is capable of receiving commands from microprocessor based machine 120, and formatting those commands for use by tester 130. In addition, host interface 132 includes circuitry that is capable of reporting status of various tests and activities performed by tester 130. Based on the disclosure provided herein, one of ordinary skill in the art will recognize a variety of host interfaces that may be employed in relation to one or more embodiments of the present invention. For example, host interface 132 may be a universal serial bus interface, a universal asynchronous receiver/transmitter interface, an RS-232 interface, an RS-422 interface, or the like. Vector sequencer 136 includes capability to receive a number of test vectors from host interface 132 and to provide the received test vectors in a desired sequence to device under test interface 138. The test vectors include a number of combinations of a threshold voltage input (VTH), a threshold comparator input (VCMP), a drive voltage (Drive), a tri-state control (TS_C), and a mask control (MASK) that are provided in a defined sequence by vector sequencer 136 to device under test interface 138. Device under test interface 138 includes circuitry in accordance with one or more embodiments of the present invention to implement a test circuit based on the aforementioned test vectors as more fully described below in relation to FIGS. 2-3 below.

Tester 130 is electrically coupled to a device under test 140. In some cases, device under test 140 includes a number of devices tested in parallel that are incorporated in a multi-site test station as more fully discussed below in relation to FIG. 4. In operation, computer readable medium 110 is programmed with a number of test vectors and commands designed to manipulate device under test interface 138 such that continuity of pins associated with device under test 140 and pin-to-pin shorts of device under test 140 are exposed, and to read back the status of the tested pins via host interface 132. Microprocessor based machine 120 accesses computer readable medium 110 to obtain the commands and test vectors, and executes the commands causing the test vectors to be loaded to tester 130. The test vectors are loaded into vector sequencer 136 via host interface 132. The sequence of test vectors is provided one after another to device under test interface 138. Based on the received test vectors, device under test interface 138 configures circuitry resulting in the application of desired tests to the pins of device under test 140. In turn, the results of the tests applied via device under test interface 138 are stored to a memory 134. The contents of memory 134 can be accessed by microprocessor based machine 120 via host interface 132. The results of the test may then be used to determine whether device(s) under test 140 pass or fail.

Turning to FIG. 2, a detailed schematic 200 of device under test interface 138 and device under test 140 is provided. It should be noted that detailed schematic shows device under test 140 as a group of configurable test circuits 240 associated with respective pins 230 of a single device under test 140, however, any number of devices under test may be serviced in parallel using multiple configurable test circuits 240 as is more fully discussed in relation to FIG. 4 below. As shown, device under test interface 138 includes a number of configurable test circuits 240 that are each coupled to respective I/O pins 230 of device under test 140. In particular, each pin 230 is connected to an I/O node 285 of a respective configurable test circuit 240. Each of pins 230 include some form of electro-static discharge protection comprising one or more diodes 231, 232. As shown, each of pins 230 is electrically coupled to VCC via a VCC diode 231 and to ground via a ground diode 232. In some cases, as will be appreciated by one of ordinary skill in the art based on reading this disclosure, pins 230 may each include only a single diode connecting the particular pin to either VCC or ground. Pins 230 are each electrically coupled to device circuitry 220 that implements the internal functionality of device under test 140.

Configurable test circuits 240 each include a threshold driver 248, a tri-state test driver 261, and a comparator 265. An input of threshold driver 248 is electrically coupled to a threshold voltage input (VTH) 249, and an output of threshold driver 248 is electrically coupled to a test pin node 282 via a current limiting resistor 252 and a threshold switch 253. Threshold driver 248 may be any type of driver capable of receiving a threshold voltage and supplying the threshold voltage to test pin node 282. Thus, for example, threshold buffer may be a voltage buffer, an RC filter, a voltage divider, a simple wire, and/or the like. Based on the disclosure provided herein, one of ordinary skill in the art will recognize a variety of circuitry and/or conductive elements that may be used to implement threshold driver 248 in accordance with the various embodiments of the present invention. Current limiting resistor 252 may be any resistive element capable of limiting the magnitude of current that is passed from threshold voltage input 249 to test pin node 282. In some cases, the value of current limiting resistor 252 is chosen such that the current provided to test pin node 282 via threshold driver 248 is substantially less than the current available to test pin node 282 via ground diode 232, VCC diode 231 or another pin 230. This assures in the proper circumstance that the voltage present at pin 230 is the primary factor in establishing the voltage at test pin node 282. In one particular instance, the value of current limiting resistor is chosen such that the magnitude of the current provided to test pin node 282 via threshold buffer 248 is less than one half the magnitude of the current provided to test pin node 282 via either ground diode 232 or via VCC diode 231. In other instances, the value of current limiting resistor is chosen such that the magnitude of the current provided to test pin node 282 via threshold buffer 248 is less than ten percent of the magnitude of the current provided to test pin node 282 via either ground diode 232 or via VCC diode 231. In yet other cases, the value of current limiting resistor is chosen such that the magnitude of the current provided to test pin node 282 via threshold buffer 248 is less than five percent of the magnitude of the current provided to test pin node 282 via either ground diode 232 or via VCC diode 231. Based on the disclosure provided herein, one of ordinary skill in the art will recognize a variety of resistive elements and resistive values that may be chosen in accordance with one or more embodiments of the present invention. Threshold switch 253 may be any device capable of selectively providing electrical connectivity between threshold input voltage 249 and pin test node 282. Thus, for example, threshold switch 253 may be an electrical relay, a transistor, or the like. Based on the disclosure provided herein, one of ordinary skill in the art will recognize a variety of circuits and/or devices that may be used to perform the functions of threshold switch 253.

An input of tri-state test driver 261 is electrically coupled to a drive data input 275, and an output of tri-state test driver 261 is electrically coupled to test pin node 282 via a measurement switch 257. Further, a tri-state control input 271 is electrically coupled to the tri-state input of tri-state test driver 261. Tri-state test driver 261 may be any type of tri-statable buffer that is known in the art. Thus, any buffer capable of driving an input signal when the buffer is not tri-stated and of being tri-stated upon assertion of a tri-state input control may be used. Such a buffer may include an internal tri-state, or include a buffer with an output that passes through a switch with the switch under control of tri-state control input 271. Measurement switch 257 may be any device capable of selectively providing electrical connectivity between tri-state test buffer 261 and pin test node 282. Thus, for example, measurement switch 257 may be an electrical relay, a transistor, or the like. Based on the disclosure provided herein, one of ordinary skill in the art will recognize a variety of circuits and/or devices that may be used to perform the functions of measurement switch 257.

One input of comparator 265 is electrically coupled to test pin node 282 via measurement switch 257. It should be noted that measurement switch 257 may be implemented with two individual switches with one of the switches electrically coupling tri-state test buffer 261 and pin test node 282, and the other electrically coupling the input of comparator 265 to pin test node 282. The other input of comparator 265 is electrically coupled to a threshold comparator input (VCMP) 269. Comparator 265 provides a sense output 279 whenever a mask control 283 is asserted. Whenever mask control output 283 is not asserted, sense output 279 is either ignored or not driven. In cases where sense output 279 is not driven (i.e., tri-stated), sense output 279 may operate as a trigger indicating an error. Thus, for example, whenever sense output 279 asserts at a defined state, an error is indicated and device under test 140 is failed. Such an approach avoids the need for maintaining a record of the results reported via sense output 279 in memory 134. Comparator 265 may be any comparator known in the art that is capable of receiving an input and comparing the input with a threshold value. Based on the disclosure provided herein, one of ordinary skill in the art will recognize a variety of comparators and/or comparator circuits that may be used in accordance with the various embodiments of the present invention.

In some cases, configurable test circuits 240 include a pair of I/O switches 255, 251 that selectively enable electrical coupling between test pin node 282 and an optional parametric tester 250. In particular, where I/O switch 255 is closed and I/O switch 251 is open, test pin node 282 is electrically coupled to a respective pin 230. Alternatively, where I/O switch 251 is closed and I/O switch 255 is closed, parametric tester 250 is electrically coupled to the respective pin 230. In some cases, parametric tester 250 and one or both of I/O switches 255, 251 are not included in configurable test circuits 240. Where included, I/O switches 255, 251 may be any device capable of selectively providing electrical connectivity between one node and another. Thus, for example, I/O switches 255, 251 may be an electrical relay, a transistor, or the like. Based on the disclosure provided herein, one of ordinary skill in the art will recognize a variety of circuits and/or devices that may be used to perform the functions of I/O switches 255, 251.

Turning now to FIG. 3, the operation of tester 130 in relation to device under test 140 is described using only a small subset of device under test interface 138 and pins 230. In particular, FIG. 3a shows configurable test circuit 240 with the various switches 253, 255, 251, 257 in the open position. When a continuity and/or pin-to-pin short test is to be performed, switches 253, 255, 257 are closed under command received from host interface 132. Switch 251 remains open. In addition, desired threshold voltages are applied to threshold voltage input (VTH) 249 and threshold comparator input (VCMP) 269 by vector sequencer 136.

One particular example of the aforementioned test configuration is shown in FIG. 3b where continuity between pin 230 and ground via ground diode 232 is determined. In particular, switches 253, 255, 257 are closed under command received from host interface 132 and switch 251 remains open, thus parametric tester 250 is no longer shown. A negative 2V is applied to threshold voltage input (VTH) 249 and a higher voltage is applied to threshold comparator input (VCMP) 269. In general, a voltage greater than threshold voltage input 249 and less than a voltage drop of ground diode 232 below ground is applied to threshold comparator input 269. Thus, threshold comparator input 269 is somewhere between negative 2V and approximately negative 0.5V (between negative 0.45V and negative 0.8V depending upon the characteristics of device under test 140). As threshold comparator input 269 holds the voltage that will be used to determine whether a continuity problem has occurred, a guard band is implemented by defining the voltage applied to threshold comparator input 269 to be substantially greater than the value of threshold input voltage 249 and substantially less than a diode drop below ground. In one particular case, threshold comparator input 269 is set at negative 1.1V. In addition, tri-state test buffer 261 is tri-stated such that it is not driving test pin node 282. Alternatively, a non tri-statable buffer may be used in place of tri-state test buffer 261 with an additional open measurement switch connecting the output of the buffer to test pin node 282. Where VCC diode 231 is included in device under test 140, the voltage rail (VCC) of device under test 140 is maintained at zero volts.

In this configuration, a source current 360 passes between threshold input voltage 249 and test pin node 282. In addition, a pin current 370 passes between ground and test pin node 282 via ground diode 232 where proper continuity exists between pin 230 and ground via ground diode 232. This results in a sense voltage 350 at test pin node 282 is detected at the input of comparator 265. Where the voltage at test node 282 is approximately one diode drop (i.e., the voltage drop across ground diode 232) below ground, proper continuity exists between pin 230 and ground via ground diode 232. Alternatively, where the voltage at test pin node 282 is near the value of threshold input voltage 249, there is a discontinuity between pin 230 and ground via ground diode 232. The voltage at test pin node 282 is determined by comparing it with threshold comparator input 269. Where the voltage at test pin node 282 is greater than or equal to threshold comparator input 269, sense output 279 indicates proper continuity and device under test 140 passes the immediate test. Alternatively, where the voltage at test pin node 282 is less than threshold comparator input 269, sense output 279 indicates improper continuity and device under test 140 is failed.

To perform the preceding test, the vector shown in Table 1 is applied to configurable test circuit 240.

TABLE 1

Vector For Testing Continuity of Pin to Ground via Ground Diode

| VTH | VCMP | Mask Control | Tri-State Control | Drive Data |
|---|---|---|---|---|
| −2 V | −1.1 V | Asserted | Asserted | X |

In Table 1 (and the other tables below) 'X' indicates a "don't care" state. The preceding vector is repeated for each pin 230 of device under test 140. Further, where multiple devices are under test in parallel, the preceding vector may be applied to pins 230 of corresponding devices in parallel. In some cases, while one pin 230 is being tested, configurable test circuits 240 associated with other pins 230 of device under test 140 have the vector of Table 2 applied to them.

TABLE 2

Static Vector for Pins Not Currently Under Test

| VTH | VCMP | Mask Control | Tri-State Control | Drive Data |
|---|---|---|---|---|
| X | X | Not Asserted | Asserted | X |

Where a number of pins are to be tested, a series of the preceding vectors are applied by vector sequencer 136 such that each pin has the vector of Table 1 applied at least one time with sense output read for the particular pin. In this way, continuity for each pin is tested. In some cases where the test is a go-no-go type of test, the vector sequence is terminated as soon as one pin indicates an improper continuity.

Another particular example of the aforementioned test configuration is shown in FIG. 3c where a pin-pin short involving pin 230a and pin 230b is determined. In particular, switches 253, 255, 257 are closed under command received from host interface 132 and switch 251 remains open, thus parametric tester 250 is no longer shown. A negative 2V is applied to threshold voltage input (VTH) 249. Tri-state control 271a associated with the pin under test is asserted so that driver 261a is not driving test pin node 282a. In contrast, the tri-state control associated with all other pins 230 of device under test 140 is not asserted such that test pin node 282 of the other configurable test circuits 240 is being driven at a known voltage level. In such cases, drivers 261 drive the known voltage onto all pins 230 except the pin under test. A voltage higher than that applied to threshold voltage input 249 and lower than the known voltage driven onto all other pins 230 is applied to threshold comparator input (VCMP) 269. Thus, where the known voltage is, for example, 0.3V, threshold comparator input 269 is somewhere between negative 2V and approximately 0.3V. As threshold comparator input 269 holds the voltage that will be used to determine whether a continuity problem has occurred, a guard band is implemented by defining the voltage applied to threshold comparator input 269 to be substantially greater than the value of threshold input voltage 249 and substantially less than the known voltage (i.e., the voltage level of pins 230 that are not under test). In one particular case, threshold comparator input 269 is set at negative 0.3V where the known voltage is set at positive 0.3V. Where VCC diodes 231 are included in device under test 140, the voltage rail (VCC) of device under test 140 is maintained at zero volts.

In this configuration, a source current 362 passes between threshold input voltage 249 and test pin node 282. For the pin under test (i.e., pin 230) a sense voltage 352 at test pin node 282 that is detected at the input of comparator 265. Where a short (indicated by the dotted lines between pin 230a and pin 230b) occurs between a pin under test (i.e., pin 230a) and any other pin (i.e., pin 230b) or ground of device under test 140, the voltage at test pin node 282a will be approximately that driven on the other pins via drive data 275 passing through enabled tri-state drivers 261. Alternatively, where there is no short between the pin under test (i.e., pin 230a) and any other pin (i.e., pin 230b) or ground in device under test 140, the voltage at test pin node 282a will be approximately that driven onto threshold voltage input 249. The voltage at test pin node 282 is determined by comparing it with threshold comparator input 269. Where the voltage at test pin node 282 is less than or equal to threshold comparator input 269, sense output 279 indicates that no shorts exist between the pin under test and any other pin of device under test 140 and device under test 140 passes the immediate test. Alternatively, where the voltage at test pin node 282 is greater than threshold comparator input 269, sense output 279 indicates a short between the pin under test and at least one other pin of device under test 140. In such a case, device under test 140 is failed.

To perform the preceding test, the vector shown in Table 3 is applied to the configurable test circuit 240 associated with the pin under test.

TABLE 3

Vector For Testing Pin-To-Pin Shorts

| VTH | VCMP | Mask Control | Tri-State Control | Drive Data |
|---|---|---|---|---|
| −2 V | −0.3 V | Asserted | Asserted | X |

The preceding vector is repeated for each pin 230 of device under test 140. Further, where multiple devices are under test in parallel, the preceding vector may be applied to pins 230 of corresponding devices in parallel. All pins other than the pin under test have the vector of Table 4 applied to them via an associated configurable test circuit 240.

TABLE 4

Static Vector for Pins Not Currently Under Test

| VTH | VCMP | Mask Control | Tri-State Control | Drive Data |
|---|---|---|---|---|
| −2 V | X | Not Asserted | Not Asserted | 0.3 V |

Where a number of pins are to be tested, a series of the preceding vectors are applied by vector sequencer 136 such that each pin has the vector of Table 3 applied at least one time with sense output read for the particular pin. In this way, continuity for each pin is tested. In some cases where the test is a go-no-go type of test, the vector sequence is terminated as soon as one pin indicates an improper continuity. It should be noted that in some cases, threshold switch 253 of all of the configurable test circuits 240 associated with the pins not under test remain open. In other cases, all threshold switches 253 are closed. Because current limiting resistors 252 are utilized, the voltage at test pin nodes 282 that are driven with drive data 275 will be near the value of drive data 275. This is because the current associated with drive data 275 is not current limited and is substantially larger than the current driven by threshold voltage input 249.

Yet another particular example of the aforementioned test configuration where continuity between pin 230 and VCC via VCC diode 232 is shown in FIG. 3d. In particular, switches 253, 255, 257 are closed under command received from host interface 132 and switch 251 remains open, thus parametric tester 250 is no longer shown. A positive 2V is applied to threshold voltage input (VTH) 249 and a lower voltage is applied to threshold comparator input (VCMP) 269. In general, a voltage greater than threshold voltage input 249 and less than a voltage drop of VCC diode 231 above ground is applied to threshold comparator input 269. Thus, threshold comparator input 269 is somewhere between positive 2V and approximately positive 0.5V (between positive 0.45V and positive 0.8V depending upon the characteristics of device under test 140). As threshold comparator input 269 holds the voltage that will be used to determine whether a continuity problem has occurred, a guard band is implemented by defining the voltage applied to threshold comparator input 269 to be substantially less than the value of threshold input voltage 249 and substantially greater than a diode drop above ground. In one particular case, threshold comparator input 269 is set at positive 1.1V. In addition, tri-state test buffer 261 is tri-stated such that it is not driving test pin node 282. Alternatively, a non tri-statable buffer may be used in place of tri-state test buffer 261 with an additional open measurement switch connecting the output of the buffer to test pin node 282.

In this configuration, a source current 361 passes between threshold input voltage 249 and test pin node 282. In addition, a pin current 371 passes between VCC (held at 0V) and test pin node 282 via ground diode 232 where proper continuity exists between pin 230 and ground via ground diode 232. This results in a sense voltage 351 at test pin node 282 that is detected at the input of comparator 265. Where the voltage at test node 282 is approximately one diode drop (i.e., the voltage drop across VCC diode 231) above ground, proper continuity exists between pin 230 and VCC via VCC diode 231. Alternatively, where the voltage at test pin node 282 is near the value of threshold input voltage 249, there is a discontinuity between pin 230 and VCC via VCC diode 251. The voltage at test pin node 282 is determined by comparing it with threshold comparator input 269. Where the voltage at test pin node 282 is less than or equal to threshold comparator input 269, sense output 279 indicates proper continuity and device under test 140 passes the immediate test. Alternatively, where the voltage at test pin node 282 is greater than threshold comparator input 269, sense output 279 indicates improper continuity and device under test 140 is failed.

To perform the preceding test, the vector shown in Table 5 is applied to configurable test circuit 240.

TABLE 5

Vector For Testing Continuity of Pin to Ground via Ground Diode

| VTH | VCMP | Mask Control | Tri-State Control | Drive Data |
|---|---|---|---|---|
| +2 V | +1.1 V | Asserted | Asserted | X |

In Table 5 (and the other tables below) 'X' indicates a "don't care" state. The preceding vector is repeated for each pin 230 of device under test 140. Further, where multiple devices are under test in parallel, the preceding vector may be applied to pins 230 of corresponding devices in parallel. In some cases, while one pin 230 is being tested, configurable test circuits 240 associated with other pins 230 of device under test 140 have the vector of Table 6 applied to them

TABLE 6

Static Vector for Pins Not Currently Under Test

| VTH | VCMP | Mask Control | Tri-State Control | Drive Data |
|---|---|---|---|---|
| X | X | Not Asserted | Asserted | X |

Where a number of pins are to be tested, a series of the preceding vectors are applied by vector sequencer 136 such that each pin has the vector of Table 5 applied at least one time with sense output read for the particular pin. In this way, continuity for each pin is tested. In some cases where the test is a go-no-go type of test, the vector sequence is terminated as soon as one pin indicates an improper continuity.

Yet a further particular example of the aforementioned test configuration is shown in FIG. 3e where a pin-pin short involving pin 230a and pin 230b is determined. In particular, switches 253, 255, 257 are closed under command received from host interface 132 and switch 251 remains open, thus parametric tester 250 is no longer shown. A positive 2V is applied to threshold voltage input (VTH) 249. Tri-state control 271a associated with the pin under test is asserted so that driver 261a is not driving test pin node 282a. In contrast, the tri-state control associated with all other pins 230 of device under test 140 is not asserted such that test pin node 282 of the other configurable test circuits 240 is being driven at a known voltage level. In such cases, drivers 261 drive the known voltage onto all pins 230 except the pin under test. A voltage lower than that applied to threshold voltage input 249 and higher than the known voltage driven onto all other pins 230 is applied to threshold comparator input (VCMP) 269. Thus, where the known voltage is, for example, negative 0.5V, threshold comparator input 269 is somewhere between positive 2V and approximately negative 0.5V. As threshold comparator input 269 holds the voltage that will be used to determine whether a continuity problem has occurred, a guard band is implemented by defining the voltage applied to threshold comparator input 269 to be substantially less than the value of threshold input voltage 249 and substantially greater than the known voltage (i.e., the voltage level of pins 230 that are not under test). In one particular case, threshold comparator input 269 is set at positive 0.3V where the known voltage is set at negative 0.5V. Where VCC diodes 231 are included in device under test 140, the voltage rail (VCC) of device under test 140 is maintained at zero volts.

In this configuration, a source current 362 passes between threshold input voltage 249 and test pin node 282. For the pin under test (i.e., pin 230) a sense voltage 353 at test pin node 282 is detected at the input of comparator 265. Where a short (indicated by the dotted lines between pin 230a and pin 230b) occurs between a pin under test (i.e., pin 230a) and any other pin (i.e., pin 230b) or VCC of device under test 140, the voltage at test pin node 282a will be approximately that driven on the other pins via drive data 275 passing through enabled tri-state drivers 261. Alternatively, where there is no short between the pin under test (i.e., pin 230a) and any other pin (i.e., pin 230b) or VCC in device under test 140, the voltage at test pin node 282a will be approximately that driven onto threshold voltage input 249. The voltage at test pin node 282 is determined by comparing it with threshold comparator input 269. Where the voltage at test pin node 282 is greater than or equal to threshold comparator input 269, sense output 279 indicates that no shorts exist between the pin under test and any other pin of device under test 140 and device under test 140 passes the immediate test. Alternatively, where the voltage at test pin node 282 is less than threshold comparator input 269, sense output 279 indicates a short between the pin under test and at least one other pin of device under test 140. In such a case, device under test 140 is failed.

To perform the preceding test, the vector shown in Table 7 is applied to the configurable test circuit 240 associated with the pin under test.

TABLE 7

Vector For Testing Pin-To-Pin Shorts

| VTH | VCMP | Mask Control | Tri-State Control | Drive Data |
|---|---|---|---|---|
| 2 V | 0.3 V | Asserted | Asserted | X |

The preceding vector is repeated for each pin 230 of device under test 140. Further, where multiple devices are under test in parallel, the preceding vector may be applied to pins 230 of corresponding devices in parallel. All pins other than the pin under test have the vector of Table 8 applied to them via an associated configurable test circuit 240.

TABLE 8

Static Vector for Pins Not Currently Under Test

| VTH | VCMP | Mask Control | Tri-State Control | Drive Data |
|---|---|---|---|---|
| 2 V | X | Not Asserted | Not Asserted | −0.5 V |

Where a number of pins are to be tested, a series of the preceding vectors are applied by vector sequencer 136 such that each pin has the vector of Table 7 applied at least one time with sense output read for the particular pin. In this way, continuity for each pin is tested. In some cases where the test is a go-no-go type of test, the vector sequence is terminated as soon as one pin indicates an improper continuity. It should be noted that in some cases, threshold switch 253 of all of the configurable test circuits 240 associated with the pins not under test remain open. In other cases, all threshold switches 253 are closed. Because current limiting resistors 252 are utilized, the voltage at test pin nodes 282 that are driven with drive data 275 will be near the value of drive data 275. This is because the current associated with drive data 275 is not current limited and is substantially larger than the current driven by threshold voltage input 249.

It should be noted that each of the individual tests illustrated by FIGS. 3b-3e may be performed one after another using a sequence of the vectors set forth above in Tables 1-8. Thus, a complex testing scheme may be easily implemented using one or more embodiments of the present invention. In such cases, the tests may continue until all pins 230 of device under test 140 are tested. Alternatively, the tests may terminate as soon as any single problem (discontinuity or short) is detected. Based on the disclosure provided herein, one of ordinary skill in the art will recognize a myriad of vector combinations that may be used in accordance with the various embodiments of the present invention.

Turning to FIG. 4, a multi-site test station 410 controlled by tester 130 and microprocessor based machine 120 is depicted. Multi-site test station 410 includes mounts for sixteen devices under test 405, 415, 420, 425, 430, 435, 440, 445, 450, 455, 460, 465, 470, 475, 480, 485. A configurable test circuit 240 exists within tester 130 for each pin of any individual devices under test. Configurable test circuits 240 may be grouped into device groups with each device group having a configurable test circuit associated with each pin of the device under test to which the group is associated. The groups of configurable test circuits 240 may then be operated in parallel with the same vectors being fed to each of the groups of configurable test circuits. In this way, testing of all sixteen devices under test may be completed in parallel. Such an approach may be used to further save testing time. It should be noted that while multi-site test station 410 is depicted with sixteen devices under test that other multi-site test stations with more or fewer than sixteen devices under test may be developed and/or utilized.

In conclusion, the present invention provides novel systems, devices, methods and arrangements for continuity testing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for testing a device under test, the method comprising:
    providing a tester, wherein the tester includes:
        a threshold driver, wherein an input of the threshold driver is electrically coupled to a threshold voltage input, and wherein an output of the threshold driver is electrically coupled to a test pin node, which is electrically coupled to a pin of the device under test;
        a test driver, wherein an input of the test driver is electrically coupled to a drive data input, and wherein an output of the test driver is electrically coupled to a first measurement switch;
        a comparator, wherein a first input of the comparator is electrically coupled to a second measurement switch, wherein a second input of the comparator is electrically coupled to a threshold comparator input;
    closing the first measurement switch and the second measurement switch, wherein the output of the test driver is electrically coupled to the test pin node, and wherein the first input of the comparator is electrically coupled to the test pin node.
    applying a first voltage to the threshold voltage input; and
    applying a second voltage greater than the first voltage to the threshold comparator input; and
    sensing an output of the comparator, wherein a voltage at the test pin node less than the second voltage is detected, and wherein the device under test is failed for lack of continuity.

2. The method of claim 1, wherein the first measurement switch and the second measurement switch are implemented using the same measurement switch.

3. The method of claim 1, wherein the second voltage is greater than the first voltage, wherein the device under test includes a ground diode electrically coupling the pin of the device under test to ground, wherein the first voltage is approximately negative 2V, wherein the second voltage is approximately negative 1.1V, and wherein the method further comprises:
    sensing an output of the comparator, wherein a voltage at the test pin node less than the second voltage is detected, and wherein the device under test is failed for lack of continuity between the pin of the device under test and ground via the ground diode.

4. The method of claim 1, wherein the second voltage is greater than the first voltage, wherein the test pin node is a first test pin node, wherein the pin of the device under test is a first pin of the device under test, and wherein the method further comprises:
    driving a second pin test node to a third voltage; and
    sensing an output of the comparator, wherein a voltage at the test pin node greater than the second voltage is detected, and wherein the device under test is failed for a short between the first pin and the second pin.

5. The method of claim 1, wherein the second voltage is greater than the first voltage, wherein the test pin node is a first test pin node, wherein the pin of the device under test is a first pin of the device under test, wherein the first voltage is approximately negative 2V, wherein the second voltage is approximately negative 0.3V, and wherein the method further comprises:
    driving a second pin test node to a third voltage, wherein the third voltage is approximately positive 0.3V; and
    sensing an output of the comparator, wherein a voltage at the test pin node greater than the second voltage is detected, and wherein the device under test is failed for a short between the first pin and the second pin.

6. The method of claim 1, wherein the second voltage is less than the first voltage, and wherein the method further comprises:
    sensing an output of the comparator, wherein a voltage at the test pin node greater than the second voltage is detected, and wherein the device under test is failed for lack of continuity.

7. The method of claim 1, wherein the second voltage is less than the first voltage, wherein the device under test includes a VCC diode electrically coupling the pin of the device under test to VCC, wherein the first voltage is approximately positive 2V, wherein the second voltage is approximately positive 1.1V, and wherein the method further comprises:
    sensing an output of the comparator, wherein a sense voltage greater than the second voltage is detected, and wherein the device under test is failed for lack of continuity between the pin of the device under test and VCC via the VCC diode.

8. The method of claim 1, wherein the second voltage is less than the first voltage, wherein the test pin node is a first test pin node, wherein the pin of the device under test is a first pin of the device under test, and wherein the method further comprises:
    driving a second pin test node to a third voltage; and
    sensing an output of the comparator, wherein a voltage at the test pin node less than the second voltage is detected, and wherein the device under test is failed for a short between the first pin and the second pin.

9. The method of claim 1, wherein the second voltage is less than the first voltage, wherein the test pin node is a first test pin node, wherein the pin of the device under test is a first pin of the device under test, wherein the first voltage is approximately positive 2V, wherein the second voltage is approximately positive 0.3V, and wherein the method further comprises
    driving a second pin test node to a third voltage, wherein the third voltage is approximately negative 0.5V; and
    sensing an output of the comparator, wherein a voltage at the test pin node less than the second voltage is detected, and wherein the device under test is failed for a short between the first pin and the second pin.

10. A high speed pin continuity and pin-to-pin short tester circuit, the tester circuit comprising:
    a threshold driver, wherein an input of the threshold driver is electrically coupled to a voltage threshold, and wherein an output of the threshold driver is electrically coupled to a test pin node via a current limiting resistor; the test pin node electrically coupled to an I/O via an I/O switch;

a test driver, wherein an input of the test driver is electrically coupled to a drive data input, and wherein an output of the test driver is electrically coupled to the test pin node; and a comparator, wherein a first input of the comparator is electrically coupled to the test pin node, wherein a second input of the comparator is electrically coupled to a threshold comparator input.

11. The tester circuit of claim 10, wherein the current limiting resistor is electrically coupled to the test pin node via a source switch.

12. The tester circuit of claim 10, wherein the second input of the comparator is electrically coupled to the test pin node via a measurement switch, and wherein the output of the test driver is electrically coupled to the test pin node via the measurement switch.

13. The tester circuit of claim 10, wherein the comparator includes a drive control, and wherein the drive control is electrically coupled to a mask control input, wherein the mask control input is operable to mask the output of the comparator.

14. The tester circuit of claim 10, wherein an output of the comparator indicates a pass/fail status of a device under test.

15. A method for testing a device under test, the method comprising:

providing a tester, wherein the tester includes:

a threshold driver, wherein an input of the threshold driver is electrically coupled to a threshold voltage input, and wherein an output of the threshold driver is electrically coupled to a test pin node;

a test driver, wherein an input of the test driver is electrically coupled to a drive data input, and wherein an output of the test driver is electrically coupled to a measurement switch; and a comparator, wherein a first input of the comparator is electrically coupled to the measurement switch, wherein a second input of the comparator is electrically coupled to a threshold comparator input;

closing the measurement switch, wherein the output of the test driver is electrically coupled to the test pin node, and wherein the first input of the comparator is electrically coupled to the test pin node;

applying a first voltage to the threshold voltage input;

applying a second voltage greater than the first voltage to the threshold comparator input; and sensing an output of the comparator, wherein a voltage at the test pin node less than the second voltage is detected, and wherein the device under test is failed for lack of continuity.

16. The method of claim 15, wherein the second voltage is less than the first voltage, wherein the test pin node is electrically coupled to a first pin of the device under test, wherein the test pin node is a first test pin node, and wherein the method further comprises:

driving a second pin test node to a third voltage; and sensing an output of the comparator, wherein a voltage at the test pin node less than the second voltage is detected, and wherein the device under test is failed for a short between the first pin and the second pin.

* * * * *